US010256399B2

(12) United States Patent
Hu et al.

(10) Patent No.: US 10,256,399 B2
(45) Date of Patent: Apr. 9, 2019

(54) FABRICATING A CAP LAYER FOR A MAGNETIC RANDOM ACCESS MEMORY (MRAM) DEVICE

(71) Applicants: International Business Machines Corporation, Armonk, NY (US); Samsung Electronics Co., Ltd., Suwon-Si (KR)

(72) Inventors: Guohan Hu, Yorktown Heights, NY (US); Kwangseok Kim, Seoul (KR); Younghyun Kim, Seoul (KR); Jung-Hyuk Lee, Seoul (KR); Jeong-Heon Park, Hwaseong-si (KR)

(73) Assignees: International Business Machines Corporation, Armonk, NY (US); Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 15/157,834

(22) Filed: May 18, 2016

(65) Prior Publication Data
US 2017/0338404 A1 Nov. 23, 2017

(51) Int. Cl.
*H01L 43/12* (2006.01)
*H01L 43/10* (2006.01)

(52) U.S. Cl.
CPC .............. *H01L 43/12* (2013.01); *H01L 43/10* (2013.01)

(58) Field of Classification Search
CPC ......... H01L 43/08; H01L 43/10; H01L 43/12; H01L 43/02; H01L 27/222; H01L 2924/0002; H01L 2924/00; H01L 23/528; H01L 27/226; H01L 27/228; H01L 29/66007; H01L 29/66984; H01F 10/3286; H01F 10/3254
See application file for complete search history.

(56) References Cited

U.S. PATENT DOCUMENTS

| 6,300,556 | B1 | 10/2001 | Yamagishi et al. |
| 6,709,767 | B2 * | 3/2004 | Lin ........................ B82Y 10/00 148/277 |
| 7,112,861 | B2 | 9/2006 | Kanakasabapathy et al. |
| 7,596,015 | B2 | 9/2009 | Kitagawa et al. |
| 8,508,006 | B2 | 8/2013 | Jan et al. |
| 8,619,394 | B1 | 12/2013 | Park et al. |
| 8,680,632 | B2 | 3/2014 | Daibou et al. |

(Continued)

OTHER PUBLICATIONS

T.-I. Cheng et al., "Perpendicular Magnetic Anisotropy Induced by a Cap Layer in Ultrathin MgO/CoFeB/Nb," Journal of Applied Physics, Aug. 6, 2012, pp. 033910-1-033910-4, vol. 112, No. 3.

(Continued)

*Primary Examiner* — Frederick B Hargrove
(74) *Attorney, Agent, or Firm* — Vazken Alexanian; Ryan, Mason & Lewis, LLP

(57) ABSTRACT

A method for manufacturing a semiconductor device includes forming a magnetic tunnel junction (MTJ) structure comprising a magnetic fixed layer, a non-magnetic barrier layer and a magnetic free layer, and forming a metal oxide cap layer on the MTJ structure, wherein forming the metal oxide cap layer comprises depositing a metal layer on the magnetic free layer, performing an oxidation of the deposited metal layer to form an oxidized metal layer, and depositing a metal oxide layer on the oxidized metal layer.

16 Claims, 4 Drawing Sheets

(56) References Cited

U.S. PATENT DOCUMENTS

| | | |
|---|---|---|
| 8,747,680 B1 | 6/2014 | Deshpande et al. |
| 8,772,845 B2 | 7/2014 | Chen et al. |
| 8,871,530 B1* | 10/2014 | Hu .................. H01L 43/02 |
| | | 257/E21.208 |
| 8,878,318 B2 | 11/2014 | Chen et al. |
| 9,059,389 B2 | 6/2015 | Hu |
| 9,059,400 B2 | 6/2015 | Beery et al. |
| 9,087,543 B2 | 7/2015 | Hu et al. |
| 2005/0008849 A1 | 1/2005 | Kagami et al. |
| 2007/0030568 A1 | 2/2007 | Ohmi et al. |
| 2009/0272958 A1 | 11/2009 | Ufert et al. |
| 2011/0293967 A1 | 12/2011 | Zhang et al. |
| 2011/0316103 A1* | 12/2011 | Uchida .................. B82Y 25/00 |
| | | 257/421 |
| 2012/0236631 A1* | 9/2012 | Park ........................ G11C 11/16 |
| | | 365/158 |
| 2012/0241878 A1 | 9/2012 | Hu et al. |
| 2012/0288963 A1* | 11/2012 | Nishimura ............. B82Y 10/00 |
| | | 438/3 |
| 2012/0300542 A1* | 11/2012 | Uchida .................. G11C 11/161 |
| | | 365/171 |
| 2013/0033931 A1* | 2/2013 | Yamane ................ G11C 11/161 |
| | | 365/171 |
| 2013/0075839 A1 | 3/2013 | Chen et al. |
| 2014/0048893 A1* | 2/2014 | Wu ........................ H01L 43/08 |
| | | 257/421 |
| 2014/0145792 A1* | 5/2014 | Wang .................. H01F 10/3272 |
| | | 331/94.1 |
| 2014/0175581 A1* | 6/2014 | Guo ........................ H01L 43/12 |
| | | 257/421 |
| 2014/0361389 A1 | 12/2014 | Hu |
| 2014/0361391 A1* | 12/2014 | Shen ...................... H01L 43/10 |
| | | 257/421 |
| 2015/0008547 A1* | 1/2015 | Pi ........................... H01L 43/04 |
| | | 257/421 |
| 2015/0091110 A1 | 4/2015 | Kuo et al. |

OTHER PUBLICATIONS

K. Lee et al., "Perpendicular Magnetizaton of CoFeB on Single-Crystal MgO," Journal of Applied Physics, Jun. 20, 2011, pp. 123910-1-123910-3, vol. 109, No. 12.

D.D. Lam et al., "MgO Overlayer Thickness Dependence of Perpendicular Magnetic Anisotropy in CoFeB Thin Films," Journal of the Korean Physical Society, May 2013, pp. 1461-1464, vol. 62, No. 10.

T. Zhu et al., "Tuning Perpendicular Magnetic Anisotropy in the MgO/CoFeB/Ta Thin Films," arXiv preprint arXiv: 1405.2551, Apr. 2014, 17 pages.

U.S. Appl. No. 14/749,770, filed Jun. 25, 2015 and entitled "Perpendicular Magnetic Anisotropy Free Layers with Iron Insertion and Oxide Interfaces for Spin Transfer Torque Magnetic Random Access Memory."

* cited by examiner

FABRICATING A CAP LAYER FOR A MAGNETIC RANDOM ACCESS MEMORY (MRAM) DEVICE

TECHNICAL FIELD

The field generally relates to semiconductor devices and methods of manufacturing same and, in particular, to improving free layer perpendicular magnetic anisotropy (PMA) by using a multi-step process to fabricate a cap layer for a magnetic random access memory (MRAM) device.

BACKGROUND

Magnetic random access memory (MRAM) (also known as magneto-resistive random access memory) is non-volatile random access memory available as an alternative to dynamic random access memory (DRAM) and static random access memory (SRAM). Data in MRAM is stored by magnetic storage elements formed from ferromagnetic layers having a non-magnetic barrier layer between the ferromagnetic layers in a configuration known as a magnetic tunnel junction (MTJ). A memory device can include a plurality of MTJ structures arranged in, for example, a grid.

A first one of the ferromagnetic layers (also referred to as a "fixed layer") has a fixed magnetic moment or polarity, and second one of the ferromagnetic layers (also referred to as a "free layer") has a variable magnetic moment or polarity which is able to be switched between same and opposite directions with respect to the magnetization direction of the fixed layer.

Same and opposite magnetic alignment with respect to the fixed layer can be referred to as "parallel" and "antiparallel" states, respectively. When the two ferromagnetic layers are aligned parallel, the resistance is considered to be "low," and when the two ferromagnetic layers are aligned anti-parallel, the resistance is considered to be "high." Changing writing current polarities changes the free layer magnetization between parallel and anti-parallel alignment with respect to the fixed layer, which respectively correspond to low resistance "0" and high resistance "1" states. Detecting changes in resistance permits an MRAM device to provide information stored in a magnetic memory element; in other words, perform a read operation.

Spin-transfer torque (STT) refers to an effect in which the orientation of a magnetic layer in an MTJ can be modified using a spin-polarized current. Charge carriers, such as electrons, have an intrinsic spin or angular momentum. An unpolarized electric current includes the same number of electrons having opposite spin from each other, and a spin polarized current includes more electrons of one spin than an opposite spin. When a current enters the fixed layer, it is polarized by reflection or transmission through the fixed layer. If the spin-polarized current is then directed into the free layer, the angular momentum can be transferred to the free layer, changing its orientation. Using the phenomenon of STT, an STT-MRAM can utilize a lower switching current than conventional MRAM, and delivers the high performance of DRAM and SRAM, at lower power and lower cost.

Magnetic anisotropy refers to the directional dependence of a material's magnetic properties. For example, the magnetic moment of magnetically anisotropic materials will tend to align with an energetically favorable direction of spontaneous magnetization, referred to an "easy axis." Improving the free layer perpendicular magnetic anisotropy (PMA), and the thermal stability of the free layer is one of the key challenges for STT-MRAM technology.

SUMMARY

According to an exemplary embodiment of the present invention, a method for manufacturing a semiconductor device includes forming a magnetic tunnel junction (MTJ) structure comprising a magnetic fixed layer, a non-magnetic barrier layer and a magnetic free layer, and forming a metal oxide cap layer on the MTJ structure, wherein forming the metal oxide cap layer comprises depositing a metal layer on the magnetic free layer, performing an oxidation of the deposited metal layer to form an oxidized metal layer, and depositing a metal oxide layer on the oxidized metal layer.

According to an exemplary embodiment of the present invention, a semiconductor device includes a magnetic tunnel junction (MTJ) structure comprising a magnetic fixed layer, a non-magnetic barrier layer and a magnetic free layer, and a metal oxide cap layer on the MTJ structure, wherein the metal oxide cap layer comprises a first metal oxide layer on the magnetic free layer, and a second metal oxide layer on the first metal oxide layer.

According to an exemplary embodiment of the present invention, a method for manufacturing a semiconductor device includes forming a metal oxide cap layer on a magnetic free layer of a magnetic tunnel junction (MTJ) structure comprising a magnetic fixed layer, a non-magnetic barrier layer on the non-magnetic barrier layer and the magnetic free layer on the non-magnetic barrier layer, wherein forming the metal oxide cap layer comprises depositing a metal layer on the magnetic free layer, performing an oxidation of the deposited metal layer to form an oxidized metal layer, and depositing a metal oxide layer on the oxidized metal layer.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Figure 1:
FIG. 1 is a cross-sectional view illustrating a first contact layer formed on a substrate in a method of manufacturing a semiconductor device according to an exemplary embodiment of the present invention.

Exemplary embodiments of the invention will now be discussed in further detail with regard to semiconductor devices and methods of manufacturing same and, in particular, to fabricating a cap layer for a magnetic random access memory (MRAM) device using a multi-step process comprising deposition and oxidation of a metal layer having good wettability characteristics with an underlying magnetic free layer.

It is to be understood that the various layers and/or regions shown in the accompanying drawings are not drawn to scale, and that one or more layers and/or regions of a type commonly used in complementary metal-oxide semiconductor (CMOS), MRAM, STT-MRAM, metal-oxide-semiconductor field-effect transistor (MOSFET), and/or other semiconductor devices in which MTJs may be used, may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), storage devices, including solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the present invention.

The embodiments of the present invention can be used in connection with semiconductor devices that may require, for example, CMOSs, MRAMs, STT-MRAMs and/or MOS-FETs. By way of non-limiting example, the semiconductor devices can include, but are not limited to CMOS, MRAM, STT-MRAM and MOSFET devices, and/or semiconductor devices that use CMOS, MRAM, STT-MRAM and/or MOSFET technology.

As used herein, "height" refers to a vertical size of an element (e.g., a layer, trench, hole, etc.) in the cross-sectional views measured from a bottom surface to a top surface of the element, and/or measured with respect to a surface on which the element is directly on. Conversely, a "depth" refers to a vertical size of an element (e.g., a layer, trench, hole, etc.) in the cross-sectional views measured from a top surface to a bottom surface of the element.

As used herein, "lateral," "lateral side," "lateral surface" refers to a side surface of an element (e.g., a layer, opening, etc.), such as a left or right side surface in the cross-sectional views.

As used herein, "width" or "length" refers to a size of an element (e.g., a layer, trench, hole, etc.) in the figures measured from a side surface to an opposite surface of the element.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to a substrate in the cross-sectional views, and "horizontal" refers to a direction parallel to a substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

Embodiments of the present invention provide a multi-step process to fabricate an oxide cap on a free layer of an MTJ structure, including deposition of a thin metal layer, mild oxidation of the thin metal layer, and formation of an oxide layer on the oxidized thin metal layer, using, for example, RF (radio frequency) sputtering from an oxide target. When compared with oxide cap structures directly deposited on a magnetic free layer, in, for example, a single step, an oxide cap layer fabricated in accordance with the multi-step process of embodiments of the present invention, exhibits higher thermal stability.

Processing according to embodiments of the present invention results in uniform and controlled initial growth of a metal oxide on an underlying magnetic layer, and prevents over-oxidation of the magnetic layer, thus providing enhanced interface perpendicular magnetic anisotropy (PMA), leading to better thermal stability. For example, due to good wettability characteristics between the underlying free layer and the thin metal layer, the thin metal layer is uniformly deposited on the free layer. As a result, the thin metal layer effectively seals the underlying free layer from oxygen access, thereby preventing or at least limiting oxygen from accessing the free layer and causing unwanted oxidation of the free layer during subsequent mild oxidation and metal oxide deposition steps. In the case of a metal oxide that is directly deposited on the free layer without deposition of the thin metal layer, oxygen from the metal oxide is able to access the free layer and cause unwanted oxidation and breaking down of the free layer.

In addition, embodiments of the present invention significantly improve free layer PMA in perpendicularly magnetized MTJs without sacrificing junction resistance area (RA) and tunnel magnetoresistance (TMR).

FIG. 1 is a cross-sectional view illustrating a first contact layer formed on a substrate in a method of manufacturing a semiconductor device according to an exemplary embodiment of the present invention. Referring to FIG. 1, a semiconductor substrate 105 may comprise semiconductor material including, but not limited to, Si, SiGe, SiC, SiGeC, III-V, II-V compound semiconductor or other like semiconductor. In addition, multiple layers of the semiconductor materials can be used as the semiconductor material of the substrate. Although not shown, according to an embodiment of the present invention, the substrate 105 includes, for example, word lines and transistors, such as, CMOS transistors, which can be used as select devices to drive write currents through respective bits for writing information. For example, in connection with an STT-MRAM, a bottom contact layer 110 (e.g., a bottom electrode) for an MTJ structure comprising fixed, free and barrier layers, is electrically connected to a source/drain of a CMOS transistor on the substrate. Accordingly, although shown on the substrate 105 for purposes of simplicity, the bottom contact layer 110 for an MTJ structure is coupled to a source/drain of a transistor on the substrate through intervening contact layers between the bottom contact layer 110 and the substrate 105. The bottom contact layer 110 can be formed using deposition techniques including, but not necessarily limited to, chemical vapor deposition (CVD), plasma enhanced CVD (PECVD), radio-frequency CVD (RFCVD), physical vapor deposition (PVD), atomic layer deposition (ALD), molecular beam deposition (MBD), pulsed laser deposition (PLD), and/or liquid source misted chemical deposition (LSMCD), sputtering, and/or plating. The bottom contact layer 110 includes an electrically conductive material, including, but not necessarily limited to, tantalum, tantalum nitride, copper, titanium, titanium nitride or a combination thereof. The bottom contact layer 110 may have a vertical thickness ranging from about 1 nm to about 50 nm.

Figure 2:
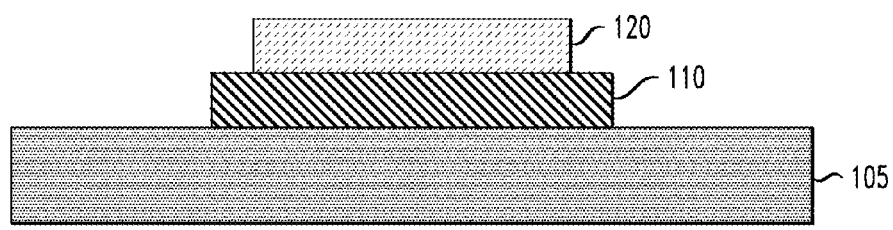
FIG. 2 is a cross-sectional view illustrating a magnetic fixed layer formed on the first contact layer in a method of manufacturing a semiconductor device according to an exemplary embodiment of the present invention.

FIG. 2 is a cross-sectional view illustrating a magnetic fixed layer formed on the first contact layer in a method of manufacturing a semiconductor device according to an exemplary embodiment of the present invention. In accordance with an embodiment of the present invention, the magnetic fixed layer 120 can be deposited on the bottom contact layer 110 using deposition techniques including, but not necessarily limited to, CVD, PECVD, RFCVD, PVD, ALD, MBD, PLD, and/or LSMCD, sputtering, and/or plating.

In accordance with an embodiment of the present invention, the magnetic fixed layer 120 can comprise, for example, a seed layer formed on the bottom contact layer 110, wherein the seed layer comprises, but is not necessarily limited to, tantalum (Ta), platinum (Pt), ruthenium (Ru), iridium (Ir), nickel (Ni), chromium (Cr), or alloys thereof, or multilayers having a stacked structure of Y on X, or X on Y, where X=Co, CoFe, CoFeB, Ni, or alloys thereof, and Y=platinum (Pt), iridium (Ir), nickel (Ni), or rhodium (Rh). In accordance with an embodiment of the present invention, the stacked structure of Y on X, or X on Y may repeat 1 to 10 times. A first pinned layer is formed on the seed layer, wherein the first pinned layer comprises, but is not necessarily limited to, PtMn CoFe, CoFeB, NiFe, IrMn, Co, CoNi, CoIr, CoPt, or multilayers having a stacked structure of Y on X, or X on Y, where X=Co, CoFe, CoFeB, Ni or alloys thereof, and Y=platinum (Pt), iridium (Ir), nickel (Ni), or rhodium (Rh). In accordance with an embodiment of the present invention, the stacked structure of Y on X, or X on Y may repeat 1 to 10 times. The magnetic fixed layer 120 can further comprise a first nonmagnetic spacer layer including, but not necessarily limited to ruthenium (Ru), rhenium (Re), osmium (Os), iridium (Ir) or alloys thereof formed on the first pinned layer, and a second pinned layer comprising the same or similar materials to that of the first pinned layer, formed on the first spacer layer. The magnetic fixed layer 120 can further comprise a second nonmagnetic spacer layer formed on the second pinned layer and comprising tantalum, tungsten, molybdenum, tantalum-iron alloy or tungsten-iron alloy for increased TMR, and a magnetic layer formed on the second nonmagnetic spacer layer and comprising CoFeB, CoFe, Co, Fe, CoB, FeB, multilayers thereof or alloys thereof. The fixed layer 120 may have a vertical thickness ranging from about 1 nm to about 20 nm.

Figure 3:
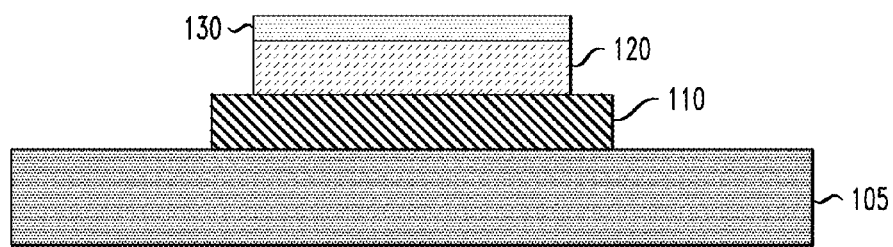
FIG. 3 is a cross-sectional view illustrating a non-magnetic barrier layer formed on the fixed layer in a method of manufacturing a semiconductor device according to an exemplary embodiment of the present invention.

FIG. 3 is a cross-sectional view illustrating a non-magnetic barrier layer formed on the fixed layer in a method of manufacturing a semiconductor device according to an exemplary embodiment of the present invention. A non-magnetic barrier layer 130 is deposited on the fixed layer 120 using deposition techniques including, but not necessarily limited to, CVD, PECVD, RFCVD, PVD, ALD, MBD, PLD, and/or LSMCD, sputtering, and/or plating. The non-magnetic barrier layer 130 can comprise, for example, one or more oxides including, but not necessarily limited to, elements such as aluminum (Al), lithium (Li), beryllium (Be), sodium (Na), magnesium (Mg), niobium (Nb), titanium (Ti), vanadium (V), tantalum (Ta), and barium (Ba), or one or more nitrides including, but not necessarily limited to, elements such as titanium (Ti) and vanadium (V). The barrier layer 130 may have a vertical thickness ranging from about 0.5 nm to about 3 nm.

Figure 4:
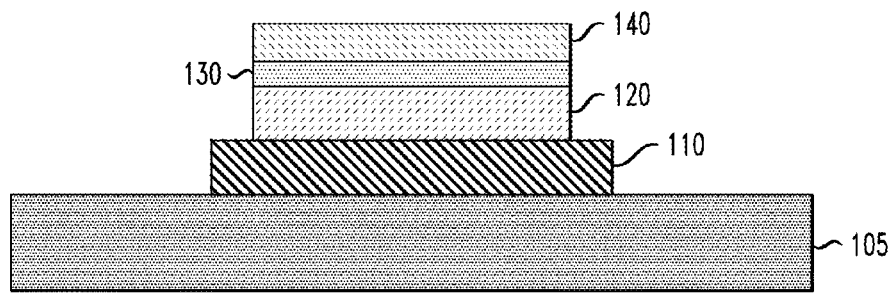
FIG. 4 is a cross-sectional view illustrating a magnetic free layer formed on the non-magnetic barrier layer in a method of manufacturing a semiconductor device according to an exemplary embodiment of the present invention.

FIG. 4 is a cross-sectional view illustrating a magnetic free layer formed on the non-magnetic barrier layer in a method of manufacturing a semiconductor device according to an exemplary embodiment of the present invention. A free layer 140 is deposited on the barrier layer 130 using deposition techniques including, but not necessarily limited to, CVD, PECVD, RFCVD, PVD, ALD, MBD, PLD, and/or LSMCD, sputtering, and/or plating. The free layer 140 can comprise materials which are the same or similar to those in the fixed layer 120. The free layer 140 may have a vertical thickness ranging from about 0.5 nm to about 5 nm.

It should be noted that the particular makeup of the MTJ structure comprising fixed, free and barrier layers shown in the figures is exemplary only, and that the embodiments of the present invention may include other MTJ structures having one or more ferromagnetic layers associated with the free and fixed layers thereof.

Figure 5A:
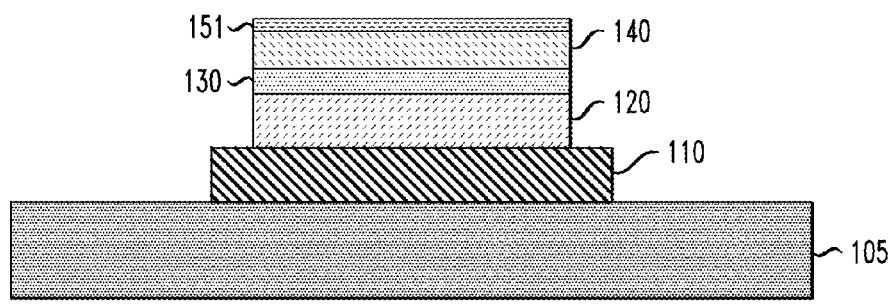
FIG. 5A is a cross-sectional view illustrating a metal layer formed on the magnetic free layer in a method of manufacturing a semiconductor device according to an exemplary embodiment of the present invention.

FIG. 5A is a cross-sectional view illustrating a metal layer formed on the magnetic free layer in a method of manufacturing a semiconductor device according to an exemplary embodiment of the present invention. In accordance with an embodiment of the present invention, a metal layer 151 can be deposited on the free layer 140 using deposition techniques including, but not necessarily limited to, CVD, PECVD, RFCVD, PVD, ALD, MBD, PLD, and/or LSMCD, sputtering, and/or plating. The metal layer 151 can comprise, for example, but is not necessarily limited to, aluminum, lithium, beryllium, sodium, magnesium, niobium, titanium, vanadium, tantalum, tungsten, barium or a combination thereof. The metal layer 151 may have a vertical thickness ranging from about 0.1 nm to about 1 nm. As noted above, the metal layer 151 should have wettability characteristics with the free layer 140 that cause uniform distribution of the metal layer 151 on the free layer 140.

Figure 5B:
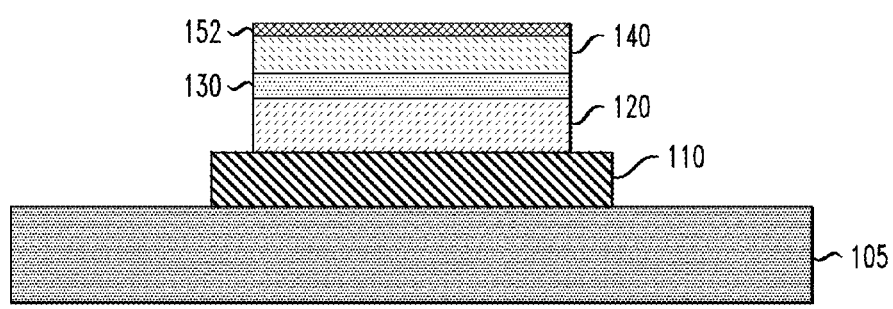
FIG. 5B is a cross-sectional view illustrating oxidation of the metal layer from FIG. 5A in a method of manufacturing a semiconductor device according to an exemplary embodiment of the present invention.

FIG. 5B is a cross-sectional view illustrating oxidation of the metal layer 151 from FIG. 5A in a method of manufacturing a semiconductor device according to an exemplary embodiment of the present invention. In accordance with an embodiment of the present invention, the metal layer 151 is oxidized using, for example, a mild oxidation process, whereby oxygen is flowed over the metal layer 151 at a temperature which can range from, for example, about 178K to about 478K to oxidize the thin metal layer 151 into a metal oxide layer 152. The oxygen can be flowed in a surfactant layer treatment using, for example, X % oxygen+ (100–X %) argon (or other noble gas, such as, for example, xenon, krypton or a combination thereof), where X=about 0.1 to about 100. The flow rate of the oxygen/argon gas can be, for example, about 5 standard cubic centimeter per minute (sccm) to about 500 sccm for about 5 seconds to about 500 seconds. According to an embodiment, the oxidation is performed without using a plasma oxidation process.

Figure 5C:
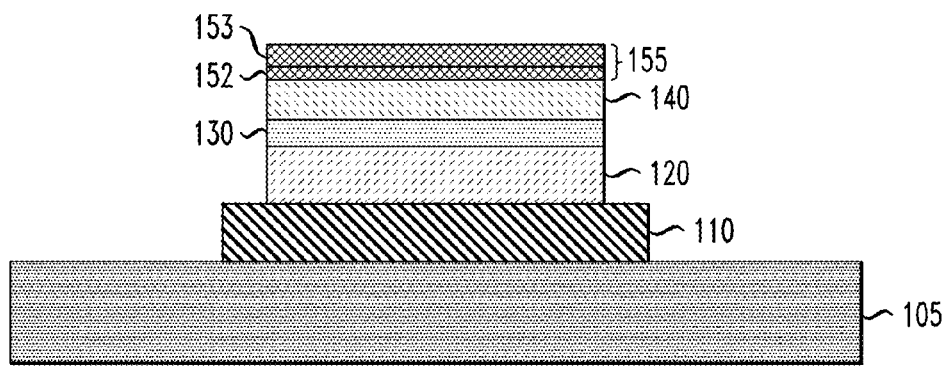
FIG. 5C is a cross-sectional view illustrating a metal oxide formed on the oxidized metal layer from FIG. 5B to form a metal oxide cap layer in a method of manufacturing a semiconductor device according to an exemplary embodiment of the present invention.

FIG. 5C is a cross-sectional view illustrating a metal oxide layer 153 formed on the oxidized metal layer 152 from FIG. 5B to form a metal oxide cap layer 155 in a method of manufacturing a semiconductor device according to an exemplary embodiment of the present invention. In accordance with an embodiment of the present invention, the metal oxide layer 153 can be deposited on the oxidized metal layer 152 using deposition techniques including, but not necessarily limited to, CVD, PECVD, RFCVD, PVD, ALD, MBD, PLD, and/or LSMCD, sputtering, and/or plating. The metal oxide 153 can comprise, for example, a metal oxide layer including, but not necessarily limited to, aluminum oxide, lithium oxide, beryllium oxide, sodium oxide, magnesium oxide, niobium oxide, titanium oxide, vanadium oxide, tantalum oxide, tungsten oxide, barium oxide or a combination thereof. The metal oxide layer 153 may have a vertical thickness ranging from about 0.3 nm to about 5 nm. In accordance with an embodiment of the present invention, the metal oxide 153 can be deposited using an RF (radio frequency) sputtering process of a metal oxide. The combination of the oxidized metal layer 152 and the metal oxide layer 153 forms the metal oxide cap layer 155. The metal oxide cap layer 155 may have a vertical thickness ranging from about 0.2 nm to about 3 nm.

Figure 6:
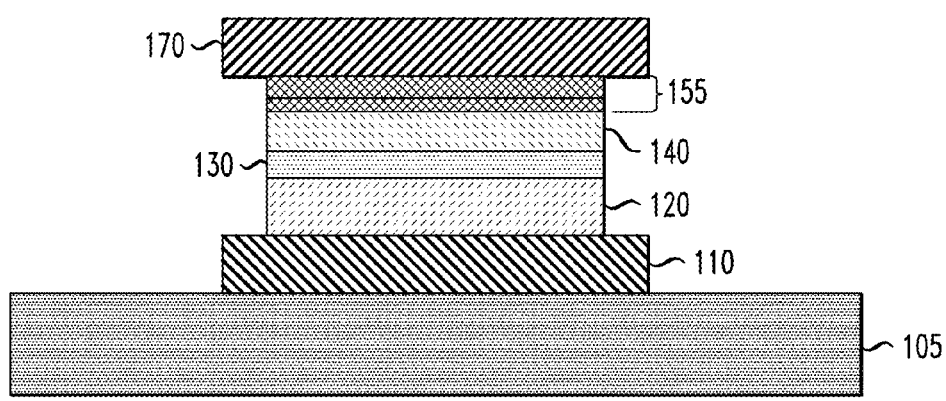
FIG. 6 is a cross-sectional view illustrating a second contact layer formed on the metal oxide cap layer in a method of manufacturing a semiconductor device according to an exemplary embodiment of the present invention.

FIG. 6 is a cross-sectional view illustrating a second contact layer formed on the metal oxide cap layer in a method of manufacturing a semiconductor device according to an exemplary embodiment of the present invention. In accordance with an embodiment of the present invention, a second or upper contact layer 170 (e.g., a top electrode) can be deposited on the metal oxide cap layer 155 using deposition techniques including, but not necessarily limited to, CVD, PECVD, RFCVD, PVD, ALD, MBD, PLD, and/or LSMCD, sputtering, and/or plating. Like the bottom contact layer 110, the second or upper contact layer 170 can comprise, for example, an electrically conductive material, including, but not necessarily limited to, tantalum, tantalum nitride, copper, ruthenium, titanium or titanium nitride. The upper contact layer 170 may have a vertical thickness ranging from about 5 nm to about 100 nm. Although not shown, according to an embodiment of the present invention, the upper contact layer 170 can be electrically connected to a bit line.

Figure 7A:
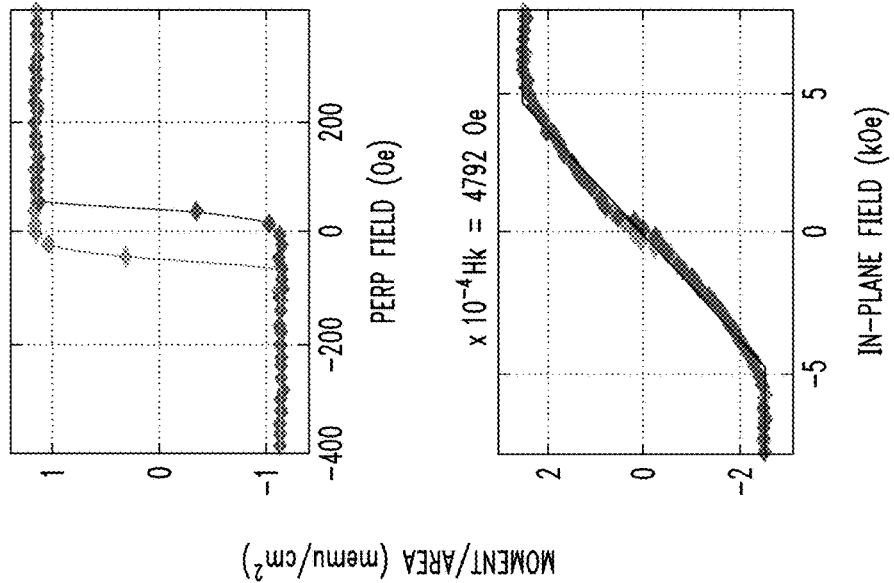
FIG. 7A illustrates plots of out-of-plane and in-plane magnetic hysteresis (M-H) loops showing PMA for MTJ stacks capped with a metal oxide cap formed by a single deposition step of metal oxide.
Figure 7B:
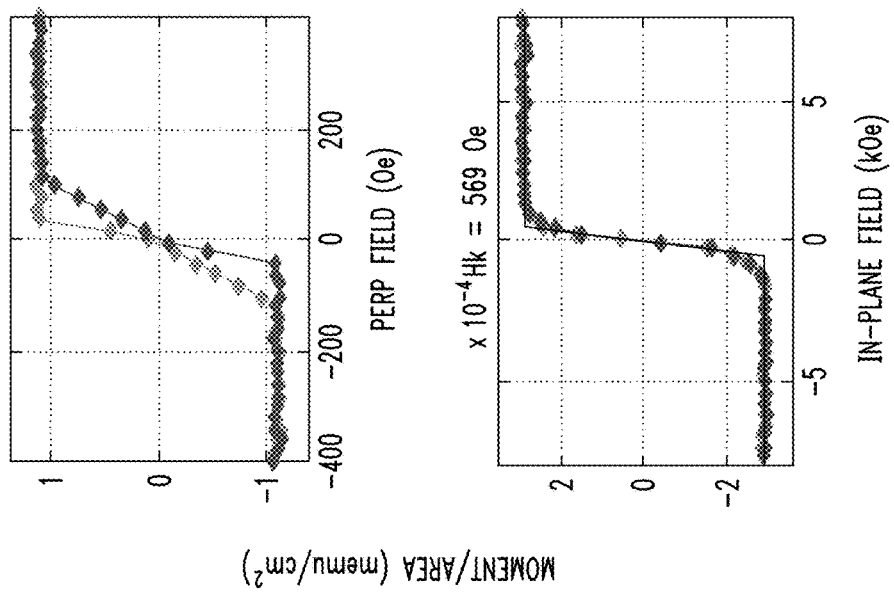
FIG. 7B illustrates plots of out-of-plane and in-plane magnetic hysteresis (M-H) loops showing PMA for MTJ stacks capped with a metal oxide cap formed by a multi-step process according to an exemplary embodiment of the present invention.

FIG. 7A illustrates plots of out-of-plane and in-plane magnetic hysteresis (M-H) loops showing PMA for MTJ stacks capped with a metal oxide cap formed by a single deposition step of metal oxide. FIG. 7B illustrates plots of out-of-plane and in-plane magnetic hysteresis (M-H) loops showing PMA for MTJ stacks capped with a metal oxide cap formed by a multi-step process according to an exemplary embodiment of the present invention. As can be seen, the magnetic field intensity is higher for MTJ stacks capped with a metal oxide cap formed by a multi-step process according to an exemplary embodiment of the present invention, as opposed to MTJ stacks capped with a metal oxide cap formed by a single deposition step of metal oxide. For example, the in-plane magnetic field intensity for an MTJ stack capped with a metal oxide cap formed by the multi-step process is 4792 Oersteds (Oe) versus 569 Oe for an MTJ stack capped with a metal oxide cap formed by a single deposition step of metal oxide. Further, the out-of-plane magnetic hysteresis (M-H) loop for an MTJ stack capped with a metal oxide cap formed by the multi-step process as shown in FIG. 7B, has a desired profile when compared with the out-of-plane magnetic hysteresis (M-H) loop for an MTJ stack capped with a metal oxide cap formed by a single deposition step as shown in FIG. 7A. In the plots, the vertical axis (y-axis) corresponds to a measure of perpendicular magnetic anisotropy showing, for example, how much in-plane field should be applied to result in an in-plane perpendicular moment. The horizontal axis (x-axis) of the plots corresponds to in-plane and out-of-plane magnetic field intensity.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A method for manufacturing a semiconductor device, comprising:
    forming a magnetic tunnel junction (MTJ) structure comprising a magnetic fixed layer, a non-magnetic barrier layer and a magnetic free layer; and
    forming a metal oxide cap layer on the MTJ structure;
    wherein forming the metal oxide cap layer comprises:
    depositing a single metal layer directly on the magnetic free layer;
    wherein the single metal layer comprises one of lithium, beryllium, and sodium;
    subsequent to depositing the single metal layer, performing an oxidation of the deposited single metal layer, wherein the entire single metal layer is converted into an oxidized metal layer comprising a single metal oxide;
    wherein performing the oxidation of the deposited single metal layer comprises flowing oxygen over the deposited single metal layer without using a plasma oxidation process; and
    depositing a metal oxide layer on the oxidized metal layer;
    wherein depositing the metal oxide layer on the oxidized metal layer comprises performing a radio frequency sputtering of the metal oxide layer;
    wherein the metal oxide layer comprises one of lithium oxide, beryllium oxide, and sodium oxide;
    wherein performing the oxidation of the deposited metal layer further comprises performing a surfactant layer treatment with a noble gas comprising a predetermined concentration of the oxygen which converts the entire single metal layer into the oxidized metal layer; and wherein the noble gas comprises at least one of xenon, krypton and a combination thereof.

2. The method according to claim 1, wherein the single metal layer has a vertical thickness ranging from about 0.1 nm to about 1 nm.

3. The method according to claim 1, wherein the predetermined concentration of the oxygen in the noble gas is about 0.1% to about 100%.

4. The method according to claim 1, wherein the metal oxide layer has a vertical thickness ranging from about 0.3 nm to about 3 nm.

5. The method according to claim 1, wherein the metal oxide cap layer comprises the oxidized metal layer, and the metal oxide cap layer has a vertical thickness ranging from about 0.2 nm to about 3 nm.

6. The method according to claim 1, further comprising forming a contact layer on the metal oxide cap layer.

7. The method according to claim 6, wherein the contact layer comprises at least one of tantalum, tantalum nitride, copper, ruthenium, titanium and titanium nitride.

8. The method according to claim 1, wherein the flowing of the oxygen over the deposited single metal layer is performed at a temperature in the range of about 178K to about 290K or about 296K to about 478K.

9. The method according to claim 1, wherein the magnetic free layer comprises at least one of PtMn, NiFe, IrMn, CoNi, CoIr, and CoPt.

10. The method according to claim 1, wherein the magnetic free layer comprises multilayers having a stacked structure of Y on X, or X on Y, where X=one of nickel (Ni) and alloys thereof, and Y=one of platinum (Pt), iridium (Ir), and rhodium (Rh).

11. A method for manufacturing a semiconductor device, comprising:

forming a metal oxide cap layer on a magnetic free layer of a magnetic tunnel junction (MTJ) structure comprising a magnetic fixed layer, a non-magnetic barrier layer on the magnetic fixed layer and the magnetic free layer on the non-magnetic barrier layer;

wherein forming the metal oxide cap layer comprises:

depositing a single metal layer directly on the magnetic free layer;

wherein the single metal layer comprises one of lithium, beryllium, and sodium;

subsequent to depositing the single metal layer, performing an oxidation of the deposited single metal layer, wherein the entire single metal layer is converted into an oxidized metal layer comprising a single metal oxide;

wherein performing the oxidation of the deposited single metal layer comprises flowing oxygen over the deposited single metal layer without using a plasma oxidation process; and depositing a metal oxide layer on the oxidized metal layer;

wherein depositing the metal oxide layer on the oxidized metal layer comprises performing a radio frequency sputtering of the metal oxide layer;

wherein the metal oxide layer comprises one of lithium oxide, beryllium oxide, and sodium oxide; and wherein performing the oxidation of the deposited metal layer further comprises performing a surfactant layer treatment with a noble gas comprising a predetermined concentration of the oxygen which converts the entire single metal layer into the oxidized metal layer; and wherein the noble gas comprises at least one of xenon, krypton and a combination thereof.

12. The method according to claim 11, wherein the single metal layer has a vertical thickness ranging from about 0.1 nm to about 1 nm.

13. The method according to claim 11, wherein the predetermined concentration of the oxygen in the noble gas is about 0.1% to about 100%.

14. The method according to claim 11, wherein the metal oxide layer has a vertical thickness ranging from about 0.3 nm to about 3 nm.

15. The method according to claim 11, wherein the flowing of the oxygen over the deposited single metal layer is performed at a temperature is in the range of about 178K to about 290K or about 296K to about 478K.

16. The method according to claim 11, wherein the magnetic free layer comprises at least one of PtMn, NiFe, IrMn, CoNi, CoIr, and CoPt.

* * * * *